United States Patent [19]
Newman

[11] Patent Number: 5,455,456
[45] Date of Patent: Oct. 3, 1995

[54] INTEGRATED CIRCUIT PACKAGE LID

[75] Inventor: Keith G. Newman, Sunnyvale, Calif.

[73] Assignee: LSI Logic Corporation, Milpitas, Calif.

[21] Appl. No.: 121,677

[22] Filed: Sep. 15, 1993

[51] Int. Cl.⁶ .......................... H01L 23/02; H01L 23/12; H01L 23/28
[52] U.S. Cl. .......... 257/704; 257/687; 257/688; 257/710; 257/738; 257/697; 257/787; 257/920
[58] Field of Search ..................... 257/666, 668, 257/687, 688, 738, 784, 790, 916, 920, 697, 704, 710

[56] References Cited

U.S. PATENT DOCUMENTS

| | | | |
|---|---|---|---|
| 4,788,626 | 11/1988 | Neidig et al. | 257/687 |
| 4,801,998 | 1/1989 | Okuaki | 257/687 |
| 5,049,979 | 9/1991 | Hashemi et al. | 257/784 |
| 5,120,678 | 7/1992 | Moore et al. | 437/183 |
| 5,153,379 | 10/1992 | Guzuk et al. | 257/910 |
| 5,166,772 | 11/1992 | Soldner et al. | 257/659 |
| 5,324,888 | 6/1994 | Tyler et al. | 257/687 |

FOREIGN PATENT DOCUMENTS

| | | | |
|---|---|---|---|
| 60-154543 | 8/1985 | Japan | 257/790 |
| 2281645 | 11/1990 | Japan | 257/697 |
| 582582 | 4/1993 | Japan | 257/738 |

*Primary Examiner*—Sara W. Crane
*Assistant Examiner*—Carl Whitehead, Jr.
*Attorney, Agent, or Firm*—Honigman Miller Schwartz and Cohn

[57] ABSTRACT

A novel lid for sealing an encapsulant within a cavity of an integrated circuit package is disclosed herein. A ring is formed around a cavity opening, where a semiconductor die is located in an integrated circuit package. A lid, having a radially extending potion biased toward the die, is adapted to engage the cavity opening. According to one embodiment of the invention, a dam ring is disposed on the top surface of an integrated circuit package so as to form the cavity opening. A radially extending potion of the lid is adapted to engage the inner or outer surface of the ring so as to retain the lid in close communication with the cavity opening and seal the encapsulant within the cavity. Alternatively, the lid can be adapted to engage the cavity opening as existing in the top surface of an integrated circuit package. The present invention is especially advantageous in conjunction with ball grid array ("BGA") packages and pin grid array ("PGA") type IC packages.

18 Claims, 5 Drawing Sheets

INTEGRATED CIRCUIT PACKAGE LID

FIELD OF THE INVENTION

This invention relates generally to integrated circuit packages, and more particularly to a novel lid for sealing an encapsulant within a cavity of an integrated circuit package.

BACKGROUND OF THE INVENTION

Semiconductor Dies; In General

Improved methods for miniaturization of semiconductor dies have permitted the integration of millions of transistor circuit elements into a single silicone embodied circuit. Such a circuit is typically referred to as an integrated circuit chip or a semiconductor die.

Semiconductor dies are created from a silicon wafer through the employment of various etching, doping and depositing steps that are well known in the art. Ultimately, the semiconductor die may be packaged by encapsulating the semiconductor die to form an "integrated circuit package" having a variety of pin-out or mounting and interconnection schemes. An integrated circuit package is hereinafter referred to as an "IC package." More sophisticated IC packages have been developed for very large scale integration ("VLSI") semiconductor dies that can accommodate the increased number of external connections required with an electronic system.

PGA and BGA Packaging

VLSI IC packages having high connection capacity are, for example, pin grid array ("PGA") and ball grid array ("BGA") type packages. Both PGA and BGA type packages, including adaptations thereof for surface mount and hybrid applications, employ one or more printed wiring boards (hereinafter referred to as "PWBs"). Such PWBs consist of, for example, polyimide, glass reinforced epoxy, ceramics, or other materials known to those skilled in the art of fabricating very large scale IC packages. Some of the PWBs have material cut out from the middle, which when laminated together, form a cavity in which a semiconductor die may be placed.

The PGA and BGA packages differ mainly in that a PGA package utilizes conductive metal pins that may be either soldered to a system printed circuit board or inserted into a matching socket which is already soldered to the system printed circuit board. In contrast, BGA packages utilize "solder balls" instead of metal pins. The solder balls of a BGA package reflow to connection points on a system printed circuit board when heated to a certain temperature, thus, electrically connecting the circuitry within the BGA IC package to an external electronic system.

Connections are made from bond pads of a semiconductor die to contact pads of PWBs, and then to conductive traces of the PWBs. The conductive traces further connect to either the connection pins or connection solder balls of a PGA or BGA package, respectively. Thus, the PGA or BGA package is a miniature multi-layer printed circuit board system containing the semiconductor die and forming a housing for protection of the die. Examples of VLSI IC packages are more fully illustrated and described in co-pending U.S. patent application Ser. No. 07/917,894 entitled "Ball Bump Grid Array Semiconductor Packages" by Michael Rostoker, Chok J. Chia, Mark Schneider, Michael Steidl, Edwin Fulcher and Keith Newman, filed on Jul. 21, 1992, and assigned to LSI Logic Corporation, the disclosure of which is incorporated by reference herein for all purposes.

IC Package Lids

A semiconductor die is ordinarily encapsulated so as to insulate the semiconductor die from adverse mechanical, chemical, electrical, and thermal environments. An encapsulant can be employed to completely fill the cavity wherein the semiconductor die is disposed. Such an encapsulant, often referred to as a "glob-top" encapsulant, is usually a highly viscous liquid or paste. Glob-top encapsulants are typically filled thermoset plastics that are based mostly on epoxy or silicone technology.

Glob-top encapsulants, such as epoxy, have relatively high viscosities. Furthermore, such encapsulants can be unevenly dispensed and are susceptible to shrinkage when cured. As a result, a glob-top encapsulant does not provide an even surface. A planar lid is employed to cover the unevenly distributed encapsulant and thus ensure that the top and bottom surfaces of an IC package are parallel with one another. Accurate testing and handling of an IC package is typically dependent on the existence of parallel top and bottom surfaces of the IC package.

Currently known technology utilizes a full body aluminum lid to seal a glob-top encapsulant within a cavity of an IC package. A full body aluminum lid covers the top surface of the IC package wherein the encapsulant filled cavity is located, as well as wraps over the sides of the top surface of the IC package in order to secure the lid to the IC package. A full body aluminum lid thus precludes decoupling chip capacitors from being advantageously disposed around the periphery of an IC package.

Full body metal lids, which are currently employed to seal a glob-top encapsulant in a cavity of an IC package, possess several attributes that are desirable of improvement. First, the coplanarity and parallelism of an IC package that employs a full body metal lid is desired to be improved. This can be accomplished by providing a lid that reduces the volume of glob-top encapsulant in the cavity of an IC package. By reducing the volume of glob-top encapsulant, the IC package substrate structure (such as PWBs) is allowed to dominate and thus reduce the level of distortion and warpage of an IC package. This, in turn, leads to improved coplanarity and parallelism of the IC package. Second, the reliability of an IC package that employs a full body metal lid is desired to be improved. Placement of a full body metal lid can trap air voids within a glob-top encapsulant during fabrication. Moisture may collect in the air voids and result in mechanical failures such as cracking and catastrophic fatigue, as well as other failures such as corrosion. Thermal performance of an IC package may also be diminished when air voids exist. A lid that reduces the likelihood of air voids within a glob-top encapsulant is thus desirable. Third, a full body metal lid fails to deter the undesirable lateral flow of encapsulant from a cavity. A lid that adequately deters such lateral flow is desired.

What is needed is a lid, which can be easily manufactured in a cost effective manner, that overcomes the aforementioned deficiencies of currently utilized full body metal lids.

SUMMARY OF THE INVENTION

Accordingly, it is an object of the present invention to more easily, reliably and cost effectively seal a glob-top encapsulant within a cavity of an IC package.

Another object of the present invention is to enable chip capacitors to be advantageously placed upon an IC package having a glob-top encapsulant. The present invention accomplishes this object by providing a lid, to seal the glob-top encapsulant, that does not extend to the periphery of the IC package.

Still another object of the present invention is to improve the parallelism and coplanarity of IC packages having glob-top encapsulants. The present invention accomplishes this object by providing a lid that includes a radially extending portion which engages the cavity opening of an IC package, so that the amount of glob-top encapsulant in the cavity is minimized.

Yet another object of the present invention is to improve the reliability and thermal characteristics of IC packages that include glob-top encapsulants which are sealed with lids. The present invention realizes such an object by providing a lid that includes a radially extending portion which displaces entrapped air, as well as a vent hole which permits the removal of excess encapsulant, so as to reduce the frequency of air voids within glob-top encapsulants.

Another object of the present invention is to provide a lid for sealing a glob-top encapsulant for IC packages that minimizes the lateral flow of encapsulant. The present invention accomplishes this object by providing a lid that engages the opening wherein the encapsulant is placed.

The present invention accomplishes the above objects, such that the deficiencies of currently known technology are overcome, by providing a novel lid which seals a glob-top encapsulant in the cavity wherein one or more semiconductor dies is disposed. The lid does not, however, extend to the periphery of an IC package. Rather, the lid engages the top surface of an IC package, or a ring placed thereon. Thus, chip capacitors can be advantageously located near the periphery of the IC package.

According to a preferred embodiment of the present invention, a ring is placed around the cavity opening of an IC package. A lid, having a radially extending portion, is placed over the cavity such that the radially extending portion engages the inner surface of the ring. The radially extending portion serves to facilitate locating the ring, as well as displacing entrapped air from uncured encapsulant so as to reduce air voids. Alternatively, the lid may include a radially extending portion that is adapted to engage the outer surface of the ring.

According to another preferred embodiment of the present invention, a lid is adapted to engage the cavity opening of an IC package. The cavity opening may be formed in a top level PWB of a tiered assembly of printed wiring boards. A lid, having a radially extending portion that corresponds to the cavity opening, is utilized to engage the cavity opening.

According to an aspect of the present invention, some of the encapsulant that is disposed within a cavity of an IC package is displaced from the cavity when the novel lid is put in place. Such displaced encapsulant serves to adhere the lid to the package substrate or a ring formed thereon.

According to an aspect of the present invention, one or more holes are included through the novel lid. This enables air that is entrapped within uncured glob-top encapsulant, as well as excess encapsulant, to escape from a cavity through the one or more holes.

Each of the above lids are advantageously employed within a PGA or BGA type IC package. Such an IC package is preferably of a cavity up design and may include a tiered assembly of printed wiring boards.

The present invention accomplishes these objects, in addition to other objects that will be described through drawings and the detailed description below.

BRIEF DESCRIPTION OF THE DRAWINGS

The foregoing and other objects, aspects and advantages of the present invention will be better understood from the following detailed description of the preferred embodiment of the invention with reference to the accompanying drawings, in which.

DETAILED DESCRIPTION OF THE PREFERRED EMBODIMENT OF THE PRESENT INVENTION

Figure 1:
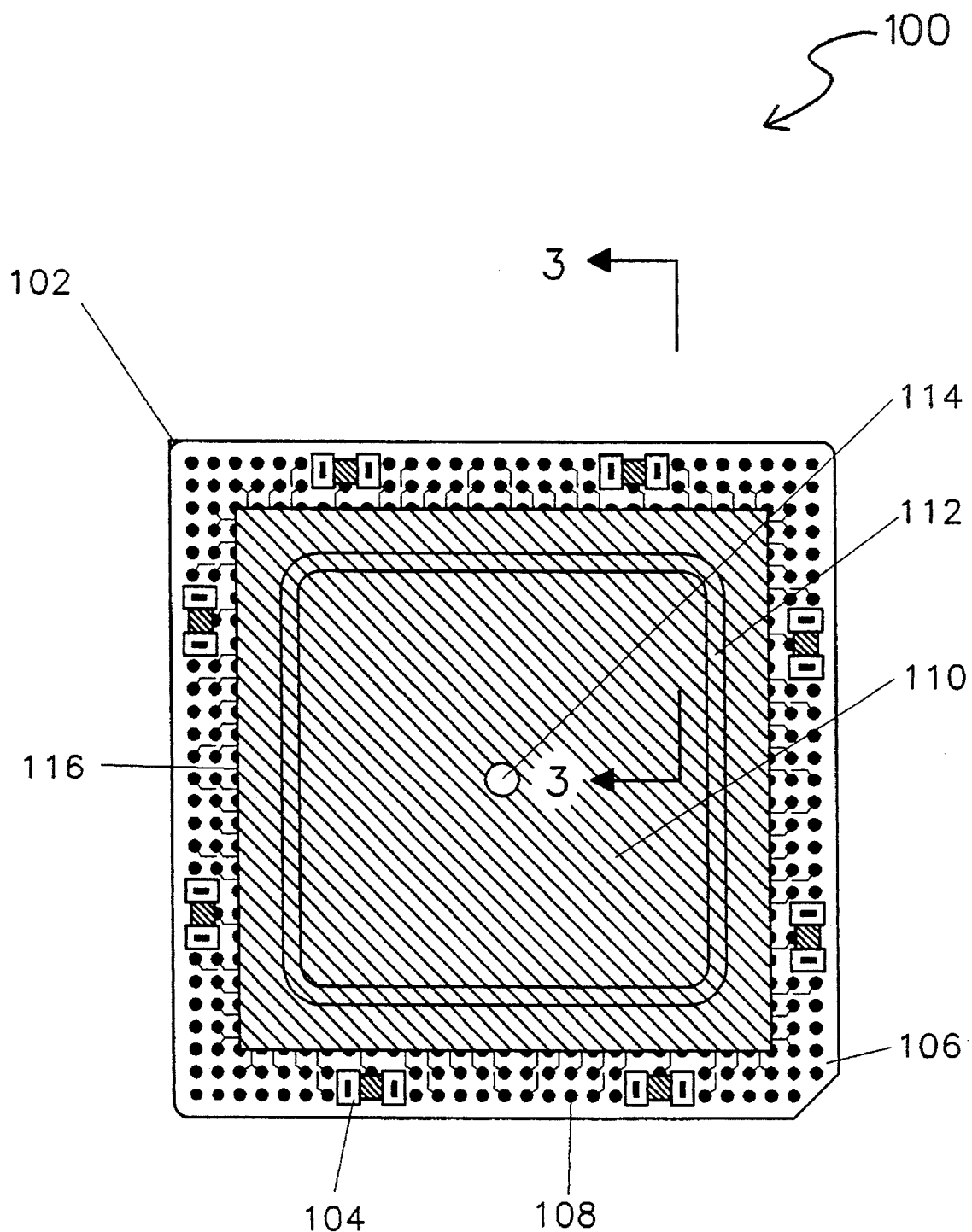
FIG. 1 illustrates a top view of an IC package, having a lid which engages an inner surface of a ring that is formed on the top surface of an IC package, in accordance with a preferred embodiment of the present invention.
Figure 3:
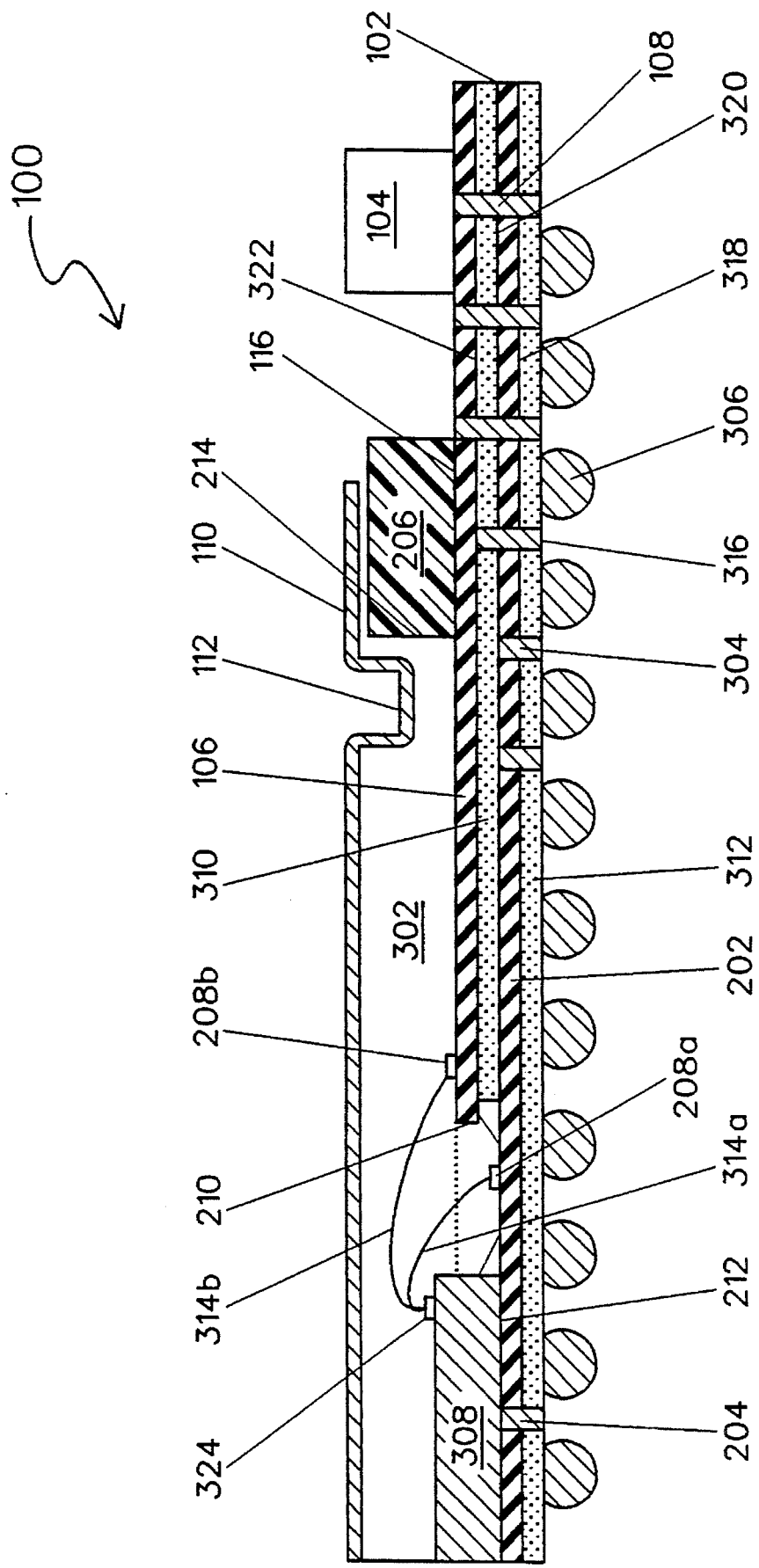
FIG. 3 illustrates a cross-sectional view of the IC package of FIG. 1, in accordance with a preferred embodiment of the present invention.

Referring to FIG. 1, a top view of an IC package, having a lid which engages an inner surface of a ring that is formed on the top surface of an IC package, in accordance with a preferred embodiment of the present invention, is illustrated. IC package 100 includes two printed wiring boards ("PWBs") that are preferably composed of a BT resin. IC package 100 includes an upper PWB, as indicated by reference numeral 106. Vias 106 are plated through upper PWB 106 in order to provide a connection between conductive traces 116 (which are further connected to a semiconductor die) and solder balls (as illustrated in FIG. 3 with reference numeral 306) of IC package 100.

The periphery of IC package 100, as well as that of upper PWB 106, is indicated by reference numeral 102. Chip capacitors 104 are disposed on upper PWB 106 at locations which are in close proximity with periphery 102. Chip capacitors 104 are utilized for noise decoupling of the power supply of IC package 100.

Covering a portion of the top surface of upper PWB 106 is a planar lid. The lid is indicated by reference numeral 110. Lid 110 serves to cover the encapsulant (which encapsulates a semiconductor die as illustrated in FIG. 3) that is located directly beneath lid 110. Lid 110 does not, however, extend to periphery 102 of IC package 100. This enables chip capacitors 104 to be disposed around periphery 102. Lid 110 includes a vent hole, as indicated by reference numeral 114, which allows entrapped air and excess encapsulant to be removed when lid 110 is placed into position. One or more vent holes are preferably located near the center of lid 110.

Figure 2:
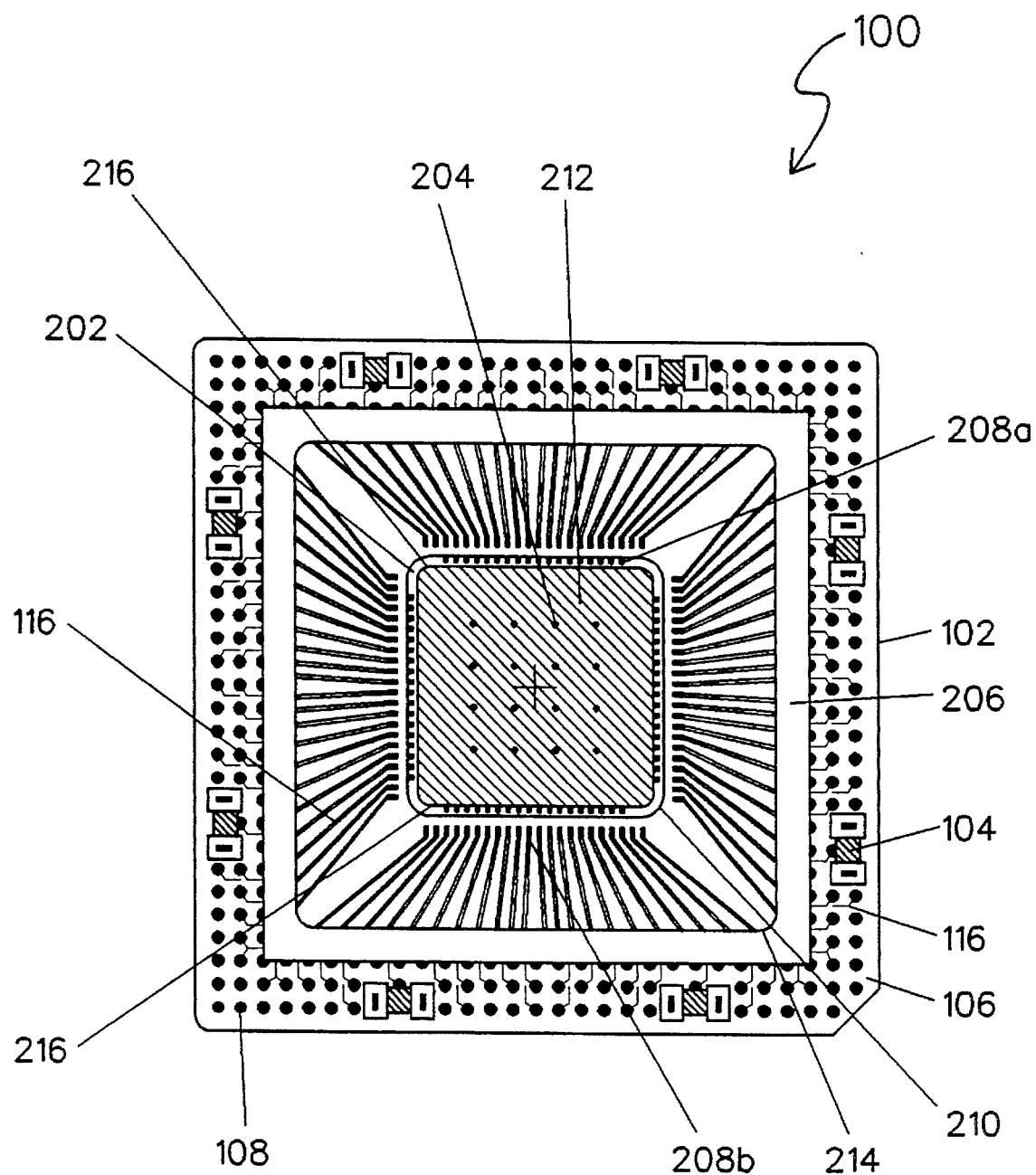
FIG. 2 illustrates a top view of the IC package of FIG. 1, with the lid removed, in accordance with a preferred embodiment of the present invention.

Preferably, lid 110 further includes a portion that radially extends toward the cavity wherein a semiconductor die and encapsulant are disposed, as indicated by reference numeral 112. Such portion 112 serves to engage a ring (as illustrated in FIG. 2 with reference numeral 206) disposed on the top surface of upper PWB 106. Portion 112 is preferably substantially rectangular and continuous in shape with curved corners. Instead of portion 112, lid 110 could alternatively include one or more depressions formed in a continuous pattern.

Lid 110 is preferably composed of a thermally conductive material that is also electrically insulated, such as anodized aluminum. A lid of anodized aluminum has a preferred thickness of 0.0508 to 0.508 of a millimeter (0.002 to 0.020 of an inch). Lid 110 is preferably of a substantially rectangular shape. However, lid 110 can be of any shape so long as it can properly be adapted to engage the cavity of IC package 100.

Referring to FIG. 2, IC package 100 is illustrated with lid 110 removed. Along with chip capacitors 104, a ring is formed on the top surface of upper PWB 106. The ring is indicated by reference numeral 206. Chip capacitors 104 are disposed in close proximity to periphery 102. In contrast, ring 206 is disposed further inward from periphery 102 such that the inner surface of ring 206, as indicated by reference numeral 214, forms the cavity opening.

A die attach pad, as indicated by reference numeral 212, is centrally located within the cavity that is delineated by inner surface 214 of ring 206. Die attach pad 212, having periphery 216, is the layer on which a semiconductor die is disposed (as illustrated in FIG. 3 with reference numeral 308). Die attach pad 212 has thermal vias 204 passing therethrough which serve to remove heat that is generated by a semiconductor die. Die attach pad 212 is disposed on the top surface of lower PWB 202. Lower PWB 202 also includes contact pads 208a. Contact pads 208a are placed along the periphery of die attach pad 212 so as to surround the semiconductor die when disposed thereon.

Laminated above lower PWB 202 is upper PWB 106. Upper PWB 106 has an opening indicated by reference numeral 210. Opening 210 provides sufficient space for contact pads 208a of lower PWB 202. Upper PWB 106 has contact pads placed around opening 210. Such contact pads are indicated by reference numeral 208b. Because of opening 210 of upper PWB 106, contact pads 208a–b are tiered with respect to one another. The tiered assembly of contact pads 208a–b is discussed more completely in United States Patent application Ser. No. 08/106,026, entitled "Integrated Circuit Package Having Multiple Bonding Tiers", by Keith G. Newman, filed Aug. 31, 1993 and allowed May 3, 1994, assigned to LSI Logic Corporation, Docket No. LLC-2258, the disclosure of which is incorporated herein by reference for all purposes. Conductive traces 116 serve to connect contact pads 208b with vias 108.

Referring to FIG. 3, a cross-sectional view of IC package 100 is illustrated. IC package 100 includes a semiconductor die as indicated by reference numeral 308. Semiconductor die 308 is connected to contact pads 208a of lower PWB 202 through bond wires 314a. Contact pads 208a of lower PWB 202 are further connected to conductive traces that are indicated by reference numeral 320. Conductive traces 320 connect with an array of vias indicated by reference numeral 304. Vias 304 connect with conductive solder ball layer 316 which, in turn, connects to solder balls 306 for connection with external circuitry. Accordingly, signals are passed between semiconductor die 308 and external circuitry through bond pads 324, through bond wires 314a, through contact pads 208a, through conductive traces 320, through vias 304, through solder ball layer 316 and through solder balls 306.

Similarly, semiconductor die 308 is connected to contact pads 208b of upper PWB 106 through bond wire 314b. Contact pads 208b of upper PWB 106 are further connected to conductive traces 116. Conductive traces 116 connect with an array of vias indicated by reference numeral 108. Vias 108 connect with conductive solder ball layer 316 which, in turn, connects with solder balls 306 for connection with external circuitry. Accordingly, signals are passed between semiconductor die 308 and external circuitry through bond pads 324, through bond wires 314b, through contact pads 208b, through conductive traces 116, through vias 108, through solder ball layer 316 and through solder balls 306.

IC package 100 is provided with a ground and power potentials. This is accomplished through a ground plane and a power plane, which are indicated by reference numerals 318 and 322, respectively. Further, upper PWB 106 is laminated to lower PWB 202 by adhesive layer 310. Similarly, lower PWB 202 is laminated to solder ball layer 316 by adhesive layer 312. Preferably, adhesive layers 310 and 312 are composed of a prepreg or B-stage material that is approximately 0.008 of an inch in thickness.

Lid 110 serves to seal an encapsulant as indicated by reference numeral 302. Encapsulant 302 is disposed in the cavity formed by ring 206, the openings of upper and lower PWBs (106 and 202), and semiconductor die 308. This is necessary to isolate and protect semiconductor die 308 from adverse mechanical, chemical, electrical and thermal environments. Lid 110 can be formed to reach any height so as to accommodate any desired amount of encapsulant 302 beneath it.

Portion 112 of lid 110 is adapted to engage inner surface 214 of ring 206. Lid 110 is secured to ring 206 by excess encapsulant 302 that is displaced from the cavity when portion 112 engages ring 206. Chip capacitors 104 are, however, enabled to be disposed around periphery 102. That is, lid 110 need not extend to periphery 102 since lid 110 is retained in place through the engagement of portion 112 with ring 206. Furthermore, the engagement of portion 112 with ring 206 ensures that lid 110 is parallel with respect to the plane formed by solder balls 306.

Encapsulant 302 is preferably formed through the application of two layers of epoxy which are cured at elevated temperatures. Furthermore, HYSOL™ FP4322 epoxy, manufactured by Dexter Corporation of Windsor Locks, Conn., is preferably employed.

A series of steps is preferably followed in order to apply encapsulant 302 and seal the same with lid 110. A bottom layer of epoxy, containing a flame retardant therein, is first applied and allowed to cure. Thereafter, a top layer of epoxy is applied. After the top layer is applied, lid 110 is placed above ring 206 and biased toward semiconductor die 308. Portion 112 facilitates the location of ring 206. Portion 112 also displaces entrapped air within the uncured top layer of encapsulant 302. Although a planar lid can be used within the context of the present invention, radially extending portion 112 serves to better displace entrapped air. Air that is entrapped within the top layer of encapsulant 302, and displaced by portion 112 is released through vent hole 114. Furthermore, any excess amount of encapsulant 302 is also passed through vent hole 114 for facilitated removal.

Alternatively, lid 110 can engage the outer surface of ring 206. This is illustrated in FIG. 4.

Figure 4:
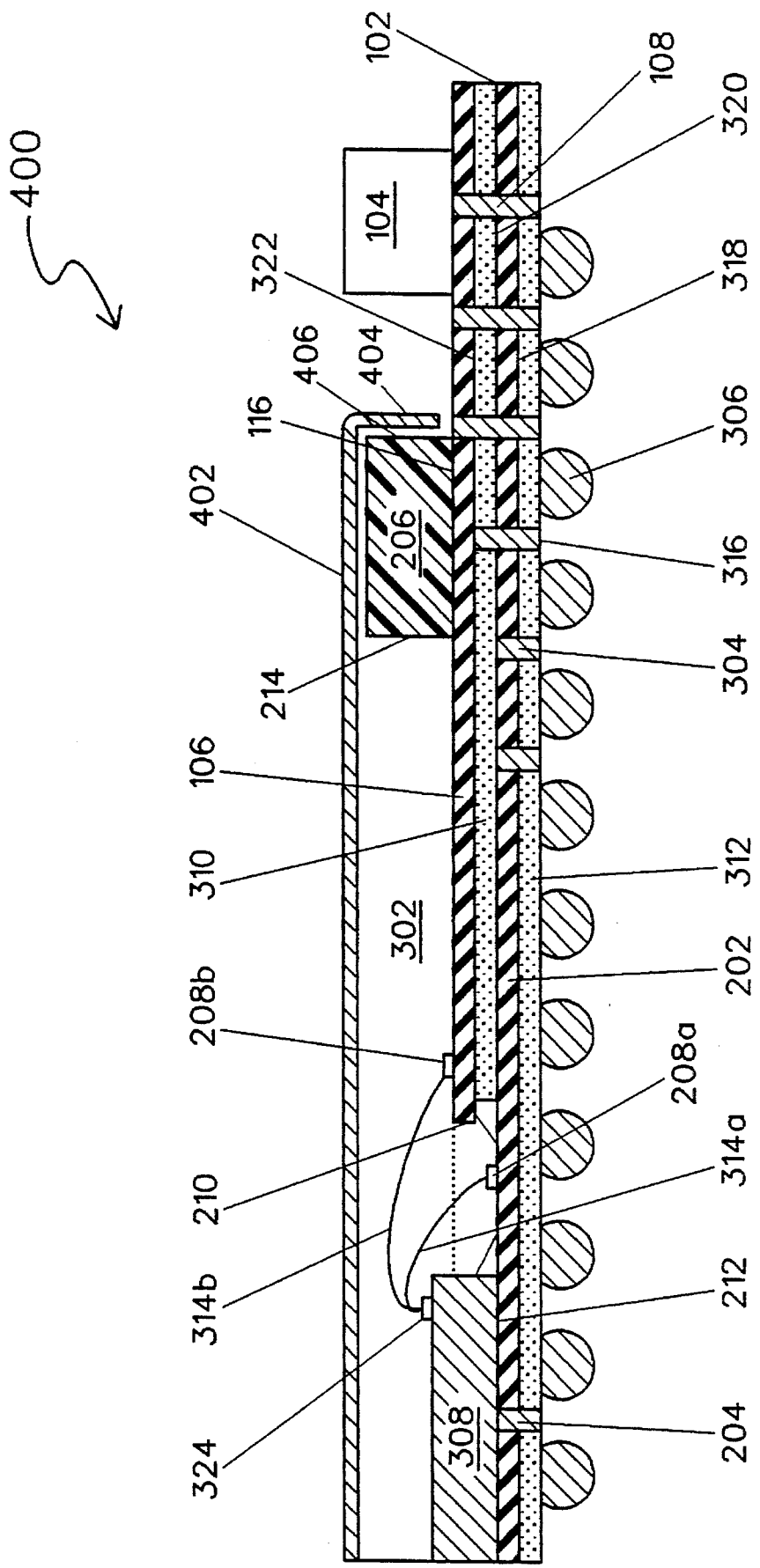
FIG. 4 illustrates a cross-sectional view of an IC package, having a lid which engages another surface of a ring that is formed on the top surface of an IC package, in accordance with a preferred embodiment of the present invention.

Referring to FIG. 4, a cross-sectional view of an IC package, having a lid that engages an outer surface of ring 206, is illustrated. IC package 400 of FIG. 4 includes a lid as indicated by reference numeral 402. Lid 402 includes a radially extending portion on its periphery, i.e. an outer rim (as opposed to portion 112 of IC package 100). Such outer rim is denoted by reference numeral 404. Outer rim 404 engages the outer surface of ring 206, as indicated by reference numeral 406, so as to provide a seal over encapsulant 302. Lid 110 is secured to ring 206 by excess encapsulant 302 that is displaced from the cavity when outer rim 404 engages ring 206.

FIGS. 1 through 4 disclose IC packages which employ a sealing lid in conjunction with a dam ring. In accordance with an alternate preferred embodiment, the present invention may be practiced in the absence of a ring. In particular, the alternate preferred embodiment of the present invention engages the opening of a package substrate such as a top level PWB. This is illustrated in FIG. 5.

Figure 5:
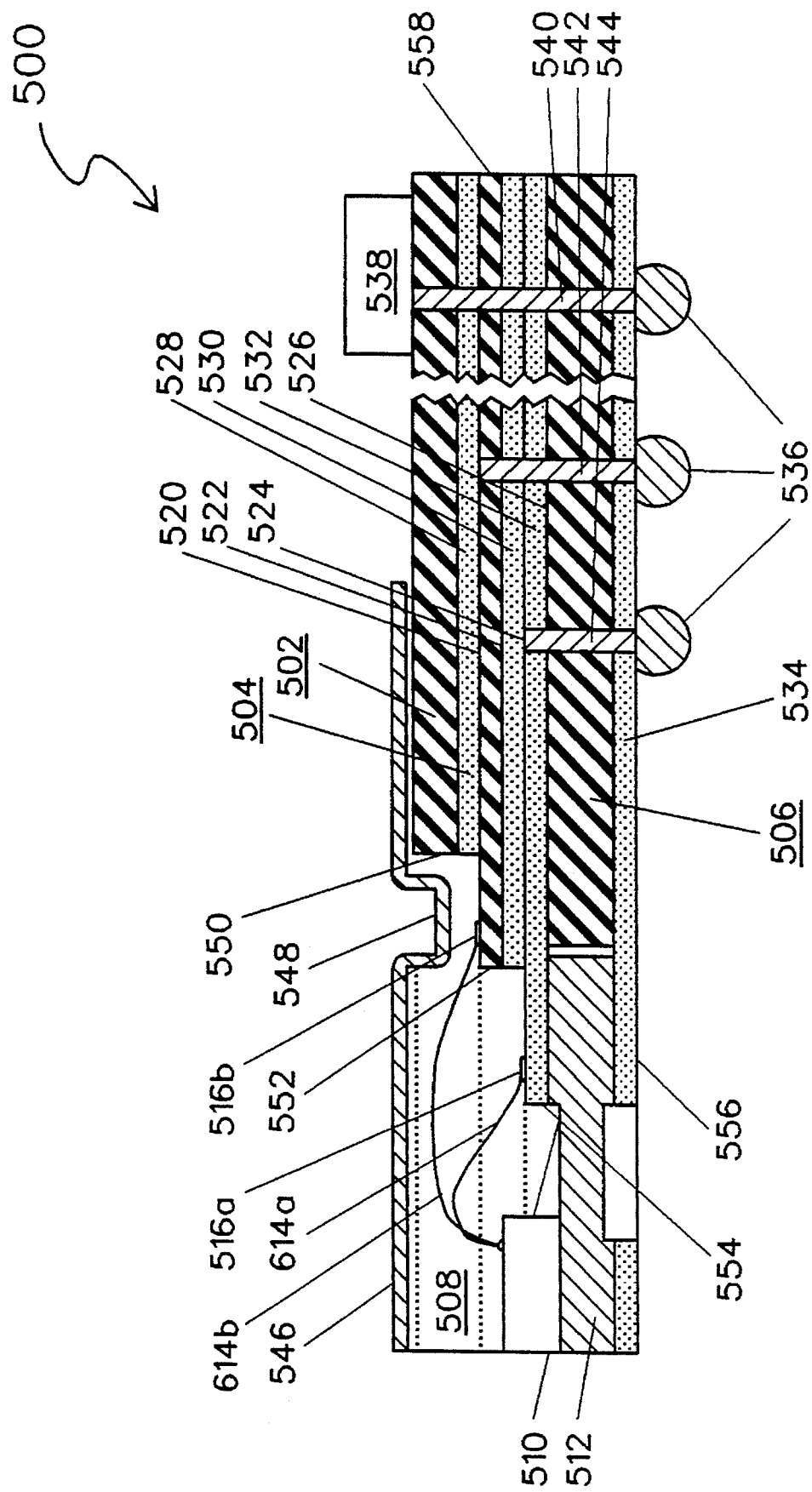
FIG. 5 illustrates a cross-sectional view of an IC package, having a lid which engages a cavity opening, in accordance with an alternate preferred embodiment of the present invention.

Referring to FIG. 5, a cross-sectional view of an IC package, having a lid which engages a cavity opening, in accordance with an alternate preferred embodiment of the present invention, is illustrated. IC package 500 includes three printed wiring boards: upper PWB 502, middle PWB 504, and lower PWB 506. Adhesive layer 528 is found between upper PWB 502 and middle PWB 504. Adhesive layers 530 and 532 are layered between middle PWB 504 and lower PWB 506. Adhesive layer 534 lies beneath lower PWB 506 and solder ball layer 556.

Semiconductor die 510 is disposed over heat slug 512 in order to dissipate the heat generated by semiconductor die 510. Semiconductor die 510 is connected to contact pads 516a and 516b by bond wires 514a and 514b, respectively. Conductive traces 520 and 524 serve to connect contact pads 516a–b to vias which are indicated by reference numerals 540, 542 and 544. Vias 540, 542 and 544 connect to solder ball layer 556. Solder ball layer 556 further connects to solder balls 536 for connection which external circuitry. Furthermore, ground and power potentials are provided to semiconductor die 510 through ground plane 526 and power plane 522, respectively.

1(2:; package 500 has a tiered cavity due to progressively larger openings of PWBs and adhesive layers. More specifically, the tiered cavity is formed by the following openings: opening 554 of adhesive layer 532, opening 552 of adhesive layer 530 and middle PWB 504, and opening 550 of adhesive layer 528 and upper PWB 502. Opening 550 thus provides for a lid, as indicated by reference numeral 546, to be engaged therewith without the need of additional structure such as a ring (as illustrated in FIGS. 1 through 4 with reference numeral 206). Accordingly, radially extending portion 548 of lid 546 is adapted to engage opening 550 so as to retain lid 546 over encapsulant 508. This enables chip capacitors 538 to be disposed on or near the periphery 558 of IC package 500. Lid 546 is secured to the top surface of upper PWB 502 by excess encapsulant that is displaced from the cavity of IC package 500 when portion 548 engages opening 550.

The apparatus and method of the present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art, and which are encompassed within the spirit of the invention and the scope of the appended claims. In particular, the present invention may be practiced within multi-chip or multi-cavity packaging environments. Furthermore, although preferred embodiments of the present invention have been described within PGA and BGA packaging environments, the present invention may be utilized within other types of packaging environments. These include, among others, gull wing lead type packages.

Having thus described the present invention, what is claimed as new and desire to secure by Letters Patent is:

1. An integrated circuit package, comprising:
    (a) a package substrate having a top and bottom surface, the top surface having a periphery and a cavity formed therein;
    (b) a semiconductor die disposed within the cavity of the package substrate;
    (c) external connection elements for connecting said integrated circuit package with external circuitry, said external connection elements connected with said semiconductor die through said package substrate;
    (d) an encapsulant filling the cavity so as to encapsulate said semiconductor die; and
    (e) a lid disposed over said cavity so as to cover said encapsulant, said lid not extending to the top surface periphery of said package substrate so that the top surface of said package substrate has an exposed periphery area, said lid including a radially extending portion that extends into the cavity.

2. The integrated circuit package as recited in claim 1, wherein said lid is secured to said package substrate by said encapsulant.

3. The integrated circuit package as recited in claim 1, wherein the radially extending portion and cavity opening are generally rectangular with curved corners.

4. The integrated circuit package as recited in claim 1, wherein the radially extending portion is continuous and substantially rectangular in shape.

5. The integrated circuit package as recited in claim 1, wherein the radially extending portion is a plurality of depressions formed in a continuous pattern.

6. The integrated circuit package as recited in claim 1, wherein the top surface of said lid is substantially flat and is oriented so as to be generally parallel with said external connection means.

7. The integrated circuit package as recited in claim 1, wherein said lid is comprised of anodized aluminum.

8. The integrated circuit package as recited in claim 1, wherein said lid includes a plurality of holes.

9. The integrated circuit package as recited in claim 1, wherein said external connection means are an array of solder balls.

10. The integrated circuit package as recited in claim 1, wherein said external connection means are an array of pins.

11. The integrated circuit package as recited in claim 1, further comprising a plurality of chip capacitors disposed on the exposed periphery area of the top surface of said package substrate and connected thereto.

12. The integrated circuit package as recited in claim 1, wherein said package substrate is a plurality of laminated printed wiring boards.

13. The integrated circuit package as recited in claim 1, wherein said encapsulant is an epoxy material.

14. An integrated circuit package comprising:
    (a) a package substrate having a top and bottom surface, the top surface having a periphery and a cavity formed therein;
    (b) a semiconductor die disposed within the cavity of the package substrate, said semiconductor die connected to said package substrate;
    (c) external connection elements connecting said semiconductor die to external circuitry;
    (d) a ring disposed on the top surface of said package substrate, said ring having an inner periphery that surrounds the cavity;

(e) a plurality of chip capacitors disposed around the top side periphery of the package substrate, said chip capacitors surrounding said ring and connecting to said package substrate;

(f) epoxy material placed within the cavity and inner periphery of said ring so as to encapsulate said semiconductor die and connections thereto; and (g) a lid disposed over said epoxy material, said lid including one or more portions that radially extend toward the cavity and engage the inner periphery of said ring.

15. The integrated circuit package as recited in claim 14, wherein said lid includes a plurality of holes.

16. The integrated circuit package as recited in claim 15, wherein the plurality of holes are centrally located on said lid.

17. An integrated circuit package, comprising:

(a) a package substrate having a cavity formed therein, said package substrate including a plurality-of printed wiring boards which define the cavity, the plurality of printed wiring boards including a base printed wiring board that forms the cavity bottom and an uppermost printed wiring board having an opening therethrough that forms the cavity opening;

(b) a semiconductor die disposed above the base printed wiring board;

(c) an encapsulant filling the cavity so as to encapsulate said semiconductor die; and (d) a lid disposed over the uppermost printed wiring board to cover said cavity opening, said lid not extending to the periphery of said package substrate, and including a radially extending portion which extends into the cavity opening.

18. The integrated circuit package as recited in claim 17, further comprising:

(a) a plurality of contact pads disposed on one or more of the plurality of printed wiring boards except for the uppermost printed wiring board, said plurality of contact pads connected to said semiconductor die; and (b) external connection elements connecting said integrated circuit package with external circuitry, said external connection elements connected to the plurality of contact pads.

* * * * *